(12) United States Patent
Morshedi et al.

(10) Patent No.: US 9,461,599 B2
(45) Date of Patent: Oct. 4, 2016

(54) DYNAMIC BIAS CURRENT ADJUSTMENT FOR POWER AMPLIFIERS

(71) Applicant: QUALCOMM Incorporated, San Diego, CA (US)

(72) Inventors: Ali Morshedi, San Diego, CA (US); Patrick Cantey, III, San Diego, CA (US); Mihir Anandpara, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/451,123

(22) Filed: Aug. 4, 2014

(65) Prior Publication Data

US 2016/0036386 A1 Feb. 4, 2016

(51) Int. Cl.
| | |
|---|---|
| H03F 1/02 | (2006.01) |
| H03F 3/21 | (2006.01) |
| H03F 3/19 | (2006.01) |
| H03G 3/10 | (2006.01) |
| H03F 1/30 | (2006.01) |
| H03F 1/56 | (2006.01) |
| H03F 3/24 | (2006.01) |

(52) U.S. Cl.
CPC .............. *H03F 3/19* (2013.01); *H03F 1/0261* (2013.01); *H03F 1/0266* (2013.01); *H03F 1/302* (2013.01); *H03F 1/56* (2013.01); *H03F 3/245* (2013.01); *H03F 2200/102* (2013.01); *H03F 2200/111* (2013.01); *H03F 2200/204* (2013.01); *H03F 2200/207* (2013.01); *H03F 2200/222* (2013.01); *H03F 2200/318* (2013.01); *H03F 2200/387* (2013.01); *H03F 2200/435* (2013.01); *H03F 2200/451* (2013.01); *H03F 2200/468* (2013.01); *H03F 2200/555* (2013.01)

(58) Field of Classification Search
USPC ......................................... 330/285, 296, 289
See application file for complete search history.

(56) References Cited

U.S. PATENT DOCUMENTS

| | | | | |
|---|---|---|---|---|
| 6,970,040 | B1 * | 11/2005 | Dening | H03F 1/0277 330/124 R |
| 8,497,737 | B2 * | 7/2013 | Langer | H03F 1/0272 330/285 |
| 8,655,293 | B2 | 2/2014 | Langer et al. | |
| 2014/0073273 | A1 | 3/2014 | Asensio et al. | |
| 2014/0073275 | A1 | 3/2014 | El-Hassan et al. | |
| 2014/0100002 | A1 | 4/2014 | Dupuis et al. | |
| 2014/0111362 | A1 | 4/2014 | Strange et al. | |

* cited by examiner

*Primary Examiner* — Hieu Nguyen
(74) *Attorney, Agent, or Firm* — Haynes and Boone, LLP

(57) ABSTRACT

In one embodiment, a circuit comprises a power amplifier. The circuit further comprises a memory that stores bias current values corresponding to a plurality of frequencies across a frequency band for setting the bias of a power amplifier based on selected frequencies, and a controller configured to provide at least one bias current value corresponding to a selected frequency from the memory to the power amplifier in response to a frequency selection signal. The bias current value at each frequency may be selected to maximize power efficiency or minimize adjacent channel leakage-power ratio of the power amplifier at said frequency. In one embodiment, the memory further stores bias current values corresponding to the plurality of frequencies across the frequency band at a plurality of temperatures for setting the bias of a power amplifier based on a temperature of the power amplifier and on selected frequencies.

18 Claims, 8 Drawing Sheets

300

| Channel | ICQ Code Value |
|---------|----------------|
| 27260   | 244            |
| 27360   | 239            |
| 27410   | 238            |
| 27460   | 248            |
| 27510   | 234            |
| 27610   | 246            |

*Fig. 3*

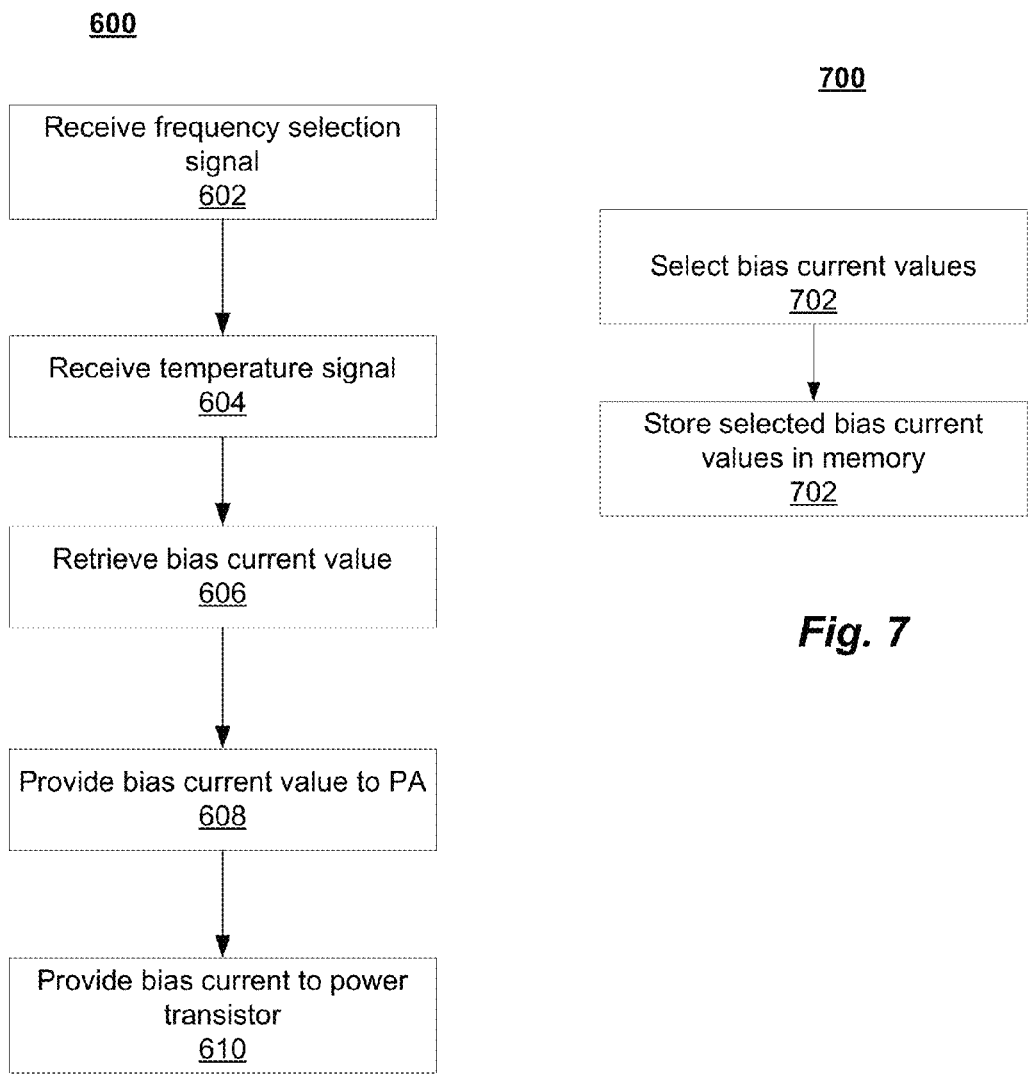

DYNAMIC BIAS CURRENT ADJUSTMENT FOR POWER AMPLIFIERS

BACKGROUND

The disclosure relates to power amplifiers, and in particular, to dynamic bias current adjustment for power amplifiers.

Unless otherwise indicated herein, the approaches described in this section are not admitted to be prior art by inclusion in this section.

As Envelope Tracking (ET) becomes more popular, power amplifiers (PAs) and duplexer modules (PADs) are being pushed to their operating limits for improved efficiency. As new PAs and PADs are improved, the main transmit metrics that are maintained in envelope tracking operation are maximum power, adjacent channel leakage ratio (ACLR) and current consumption. Conventional PAs optimize PA output matching based on the optimum PA parameters at one frequency.

SUMMARY

The present disclosure provides methods for dynamic bias current adjustment for power amplifiers and power amplifiers including dynamic bias current adjustment.

In one embodiment, the disclosure provides a circuit that comprises a power amplifier. The circuit further comprises a memory that stores bias current values corresponding to a plurality of frequencies across a frequency band for setting the bias of a power amplifier based on selected frequencies, and a controller configured to provide at least one bias current value corresponding to a selected frequency from the memory to the power amplifier in response to a frequency selection signal.

In one embodiment, the bias current value at each frequency is selected based on a power metric of the power amplifier at said frequency.

In one embodiment, the bias current value at each frequency is selected to minimize adjacent channel leakage-power ratio of the power amplifier at said frequency.

In one embodiment, the memory further stores bias current values corresponding to the plurality of frequencies across the frequency band at a plurality of temperatures for setting the bias of a power amplifier based on a temperature of the power amplifier and on selected frequencies.

In one embodiment, the bias current value is selected at different temperatures to maximize the power efficiency of the power amplifier at each temperature.

In one embodiment, the power amplifier further comprises a power transistor, and a bias controller that provides a bias current to the power transistor in response to the bias current value.

In one embodiment, the circuit further comprises an envelope digital-to-analog controller for envelope tracking.

In one embodiment, the disclosure provides a method comprising: receiving a frequency selection signal; retrieving from a memory a bias current corresponding to a channel based on the frequency selection signal, the memory stores bias current values corresponding to a plurality of frequencies across a frequency band for setting the bias of a power amplifier based on selected frequencies; and providing the retrieved bias current to the power amplifier.

In one embodiment, the method further comprises biasing at least one power transistor in response to the retrieved bias current.

In one embodiment, the method further selecting the bias current value at each frequency to maximize power efficiency of the power amplifier at said frequency.

In one embodiment, the method further comprises selecting the bias current value at each frequency to minimize adjacent channel leakage-power ratio of the power amplifier at said frequency.

In one embodiment, the memory further stores bias current values corresponding to a plurality of frequencies across a frequency band at a plurality of temperatures for setting the bias of a power amplifier based on a temperature of the power amplifier and on selected frequencies.

In one embodiment, the method further comprises selecting the bias current value at different temperatures to maximize the power efficiency of the power amplifier at each temperature.

In one embodiment, the method further comprises receiving a temperature signal indicative of the temperature of the power amplifier; and retrieving from the memory a bias current corresponding to a channel based on the frequency selection signal and the temperature signal.

In one embodiment, the power amplifier comprises a power transistor. The method further comprises providing a bias current to the power transistor in response to the bias current value.

In one embodiment, the method further comprises envelope tracking peak power of a radio frequency input to the power amplifier; and adjusting a supply voltage applied to the power amplifier in response to the enveloped tracked peak power.

In one embodiment, the disclosure provides a method comprising: selecting, from a plurality of performance values of a power amplifier as a function of bias current corresponding to a plurality of frequencies across a frequency band, a bias current value for each frequency in response to a selection criteria of performance; and storing in a memory the selected bias current values in association with the corresponding frequencies.

In one embodiment, the selection criteria of performance is maximization of power efficiency of the power amplifier at said frequency.

In one embodiment, the selection criteria of performance is minimization of adjacent channel leakage-power ratio of the power amplifier at said frequency.

In one embodiment, the performance values further are a function of temperature of the power amplifier.

In one embodiment, the disclosure provides a method comprising: applying a radio frequency input signal having a frequency to a power amplifier; applying a plurality of bias currents to the power amplifier; detecting a radio frequency output signal from the power amplifier; determining a performance metric of the power amplifier from the radio frequency output signal for each bias current of the plurality of bias currents; and selecting a bias current to bias the power amplifier based on a criteria of the detected performance metrics.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure.

In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings:

FIG. 3 illustrates a table of the channels and bias current values for the frequency band according to an embodiment.

FIG. 6 illustrates a simplified diagram of a process flow for controlling bias of a power amplifier according to an embodiment.

FIG. 7 illustrates a simplified diagram of a process flow for selecting bias values for a power amplifier according to an embodiment.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
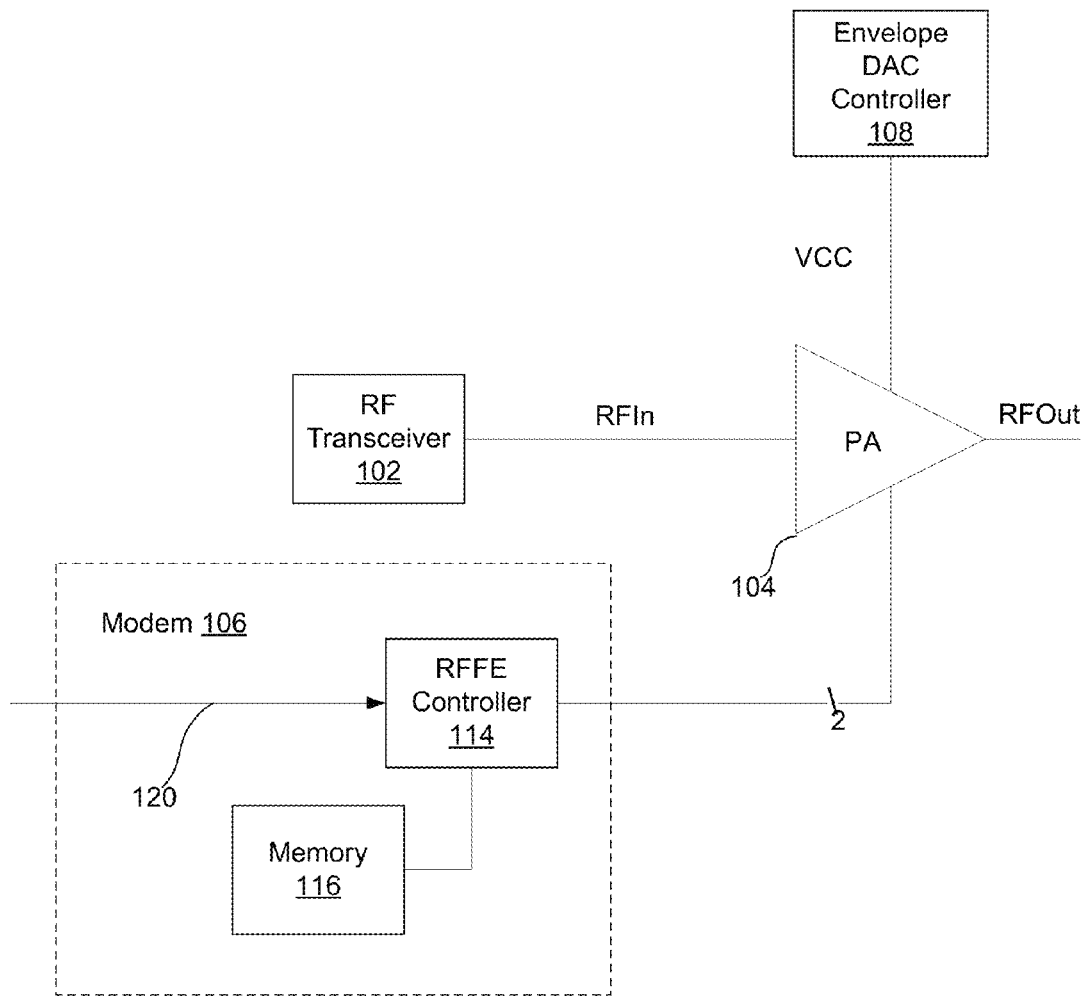
FIG. 1 illustrates a block diagram of a power amplifier (PA) system according to an embodiment.

FIG. 1 illustrates a block diagram of a power amplifier (PA) system 100 according to an embodiment. In contrast to a system that provides a single bias value across the frequency range, the power amplifier systems herein may provide dynamic biasing of the power amplifier based on frequency and may also be based on temperature to maximize or optimize performance at each frequency. Performance may be quantified by, for example, power amplifier metrics, such as maximum power, adjacent channel leakage ratio (ACLR), or current consumption. PA system 100 comprises a radio frequency (RF) transceiver 102, a power amplifier 104, a modem 106, and an envelope digital-to-analog converter (DAC) controller 108. Modem 106 comprises an RF front end (RFFE) controller 114 and a memory 116.

Memory 116 stores bias current (ICQ) values to bias PA 104 for different frequencies across a frequency band to improve the efficiency or performance of the power amplifier. In some embodiments, memory 116 also stores bias current (ICQ) values to bias PA 104 for different temperatures to improve the efficiency or performance of the power amplifier. In some embodiments, adjacent channel leakage-power ratio (ACLR) is one measure of amplifier efficiency of the power amplifiers described herein.

PA 104 generates an RF output (RFOut) in response to an RF input (RFin) from RF transceiver 102. Envelope DAC controller 108 controls the supply voltage VCC to PA 104 for envelope tracking to change the supply voltage VCC based on the peak power of the RF input (RFIn).

The one or more bias values from memory 116 are programmed into a bias current (ICQ) register or registers in PA 104 to set a bias current (ICQ) for PA 104. RF front end (RFFE) controller 114 generates clock and data for PA 104 including the ICQ register value for a selected RF channel in response to a frequency selection signal 120 from an external system (not shown).

Although memory 116 is described as external to PA 104, memory 116 may be internal to PA 104.

Figure 2:
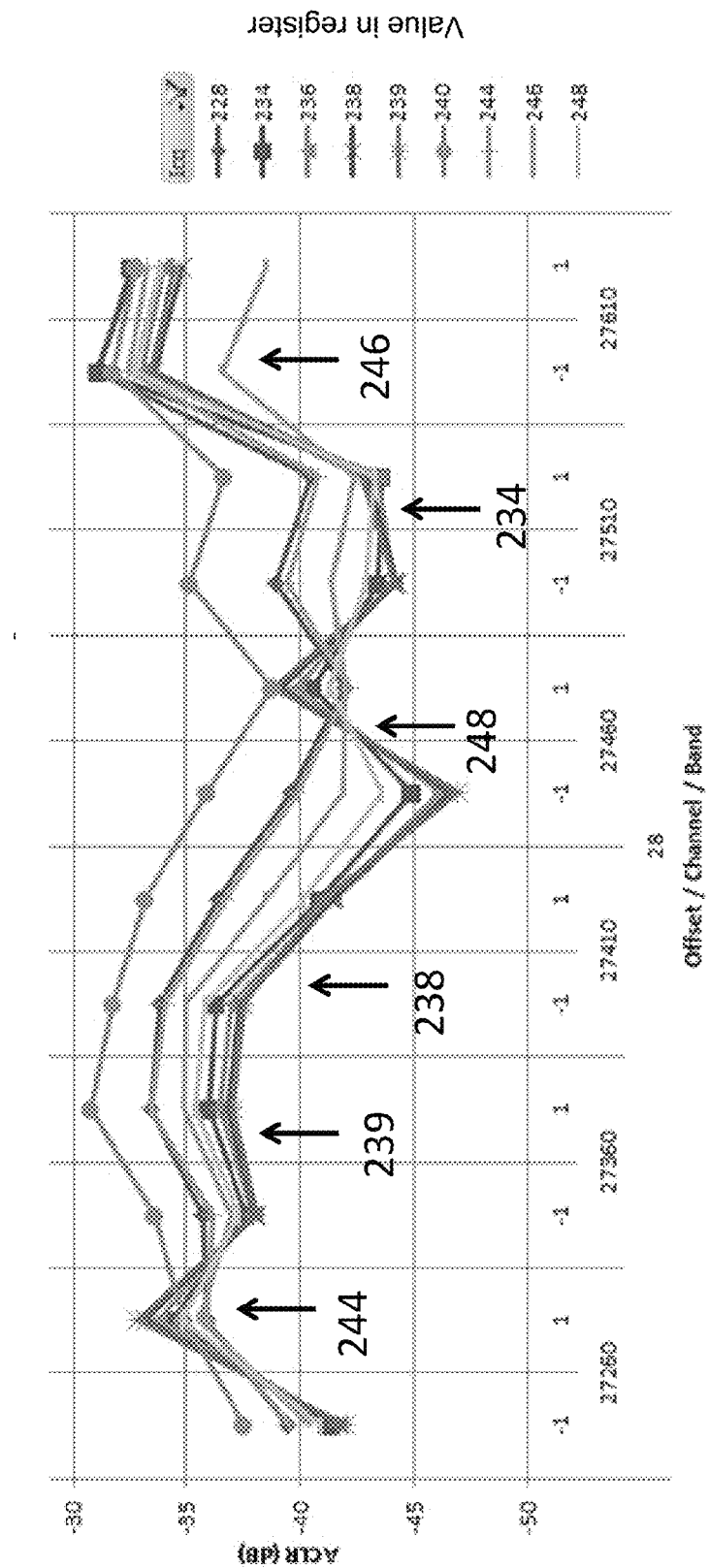
FIG. 2 illustrates adjacent channel leakage ratio as a function of channel/band of a power amplifier according to an embodiment.

FIG. 2 illustrates the ACLR as a function of channel/band of a power amplifier according to an embodiment. RFFE controller 114 selects a bias current value in the memory based on the particular channel (frequency) being used to minimize ACLR (or improve or maximize efficiency) for the channel. For example, RFFE controller 114 selects ICQ value 244 for channel 27260 and selects ICQ value 248 for channel 27460.

The channels shown in FIG. 2 includes an offset of plus one (+1) and minus one (−1). In this example, the +1 offset is 7.5 MHz above the carrier, and the −1 offset is 7.5 MHz below the carrier.

For each channel, the bias that provides the minimum ACLR is selected and stored in memory 116. In some embodiments, the bias values are coded in memory 116. The code is provided to PA 104, where it is mapped to a bias current or currents for the power transistor or transistors in PA 104.

For example, the code 244 is the number stored in memory 116. When the corresponding channel is selected, the code 244 is stored in the register in PA 104, and is mapped to a corresponding bias current.

A calibration procedure may be used to determine the ACLR function shown in FIG. 2. For each bias current value, the ACLR is measured for each channel, including positive and negative offsets from the carrier, across the frequency band. For each channel, the bias current value that has the minimum ACLR is selected, and stored, or a code associated with the bias current value is stored, in memory 116 in a table, such as shown in FIG. 3.

FIG. 3 illustrates a table 300 of the channels and bias current values for the frequency band according to an embodiment. Table 300 is stored in memory 116. Table 300 includes an ICQ value for each channel. Although only eight channels are shown in FIGS. 2 and 3, other numbers of channels may be used and stored in table 300.

For simplicity and clarity, the ACLR as a function of frequency is shown in FIG. 2 for only one temperature, and the table of the channels and ICQ values is shown in FIG. 3 for only one temperature. The ACLR may be determined as a function of frequency over a temperature range, such as an expected operating temperature range of the power amplifier. The table 300 may be expanded to include ICQ code values for a plurality of different temperatures for each channel.

Figure 4:
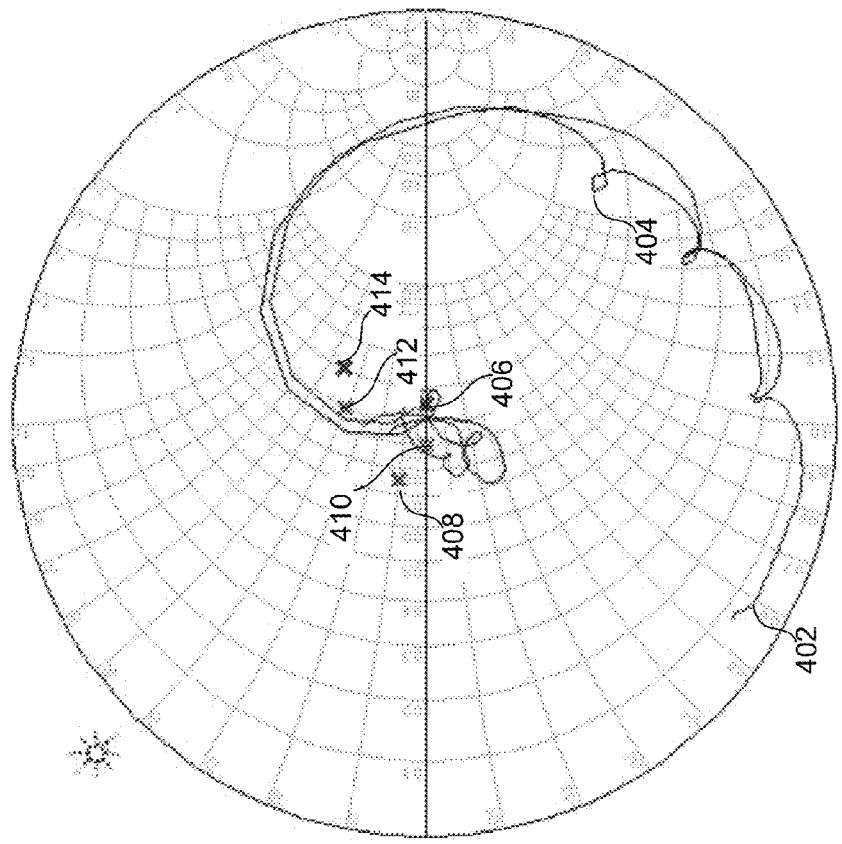
FIG. 4 illustrates a Smith chart of impedance variation as a function of frequency and temperature for an example power amplifier.

FIG. 4 illustrates a Smith chart 400 of impedance variation as a function of frequency and temperature for an example power amplifier. A line 402 illustrates the impedance of the example power amplifier for a frequency range at 25° C. A line 404 illustrates the impedance of the example power amplifier for a frequency range at 60° C. A point 406 illustrates the error vector magnitude (EVM) of the power amplifier. A point 408 illustrates the efficiency of the power amplifier. A point 410 illustrates the gain of the power amplifier. A point 412 illustrates the output power (Pout) of the power amplifier. A point 414 illustrates the ACLR of the power amplifier.

Figure 5:
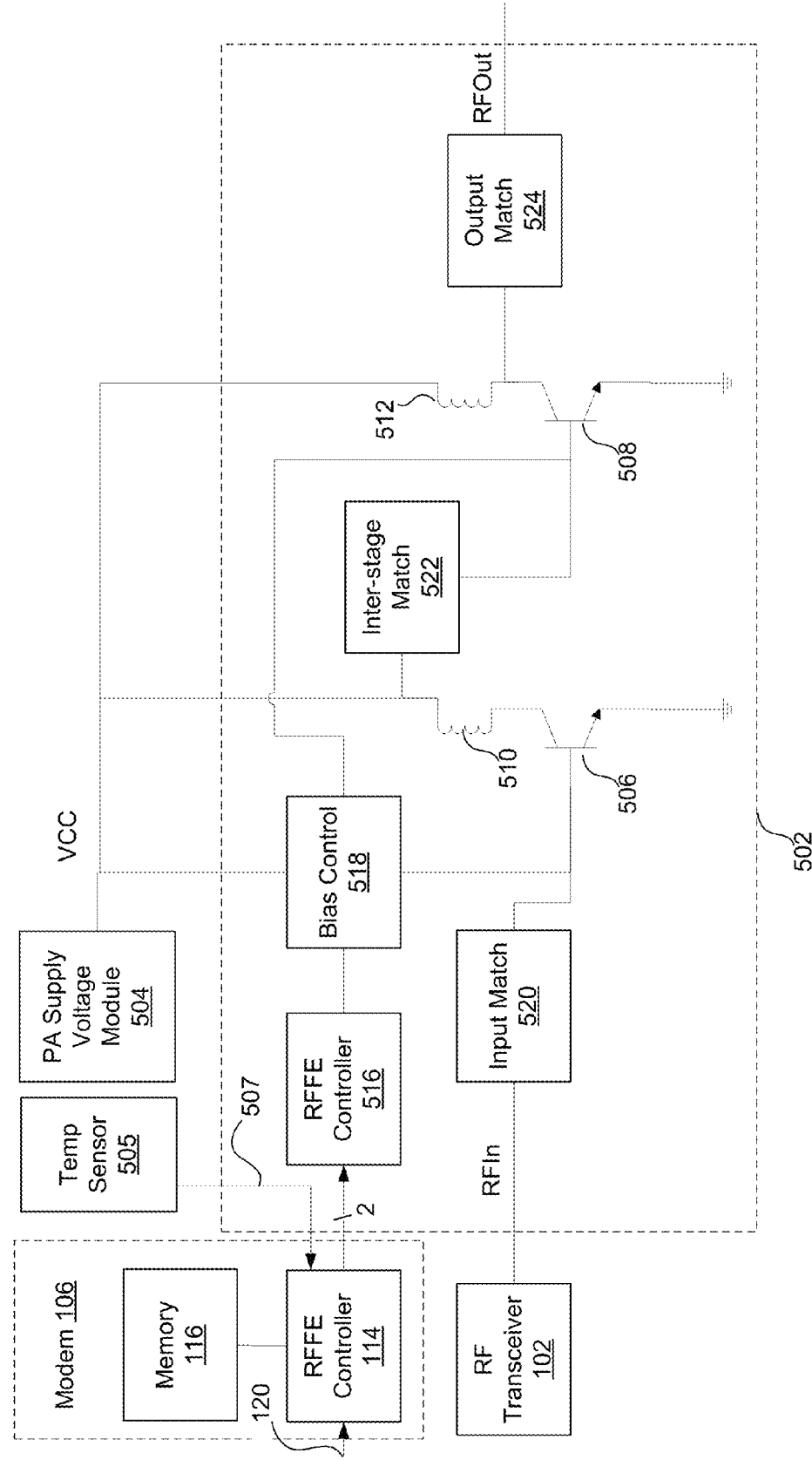
FIG. 5 illustrates a block diagram of a power amplifier (PA) system according to an embodiment.

FIG. 5 illustrates a block diagram of a power amplifier (PA) system 500 according to an embodiment. PA system 500 comprises a radio frequency (RF) transceiver 102, a modem 106, a power amplifier 502, a power amplifier supply voltage module 504, and a temperature sensor 505. In some embodiments, power amplifier supply voltage module 504 is an envelope DAC controller 108.

PA 502 generates an RF output (RFOut) in response to an RF input (RFin) from RF transceiver 102. Power amplifier supply voltage module 504 controls the supply voltage VCC to PA 502, which may include envelope tracking for changing the VCC based on the peak power of the RF input (RFIn). Temperature sensor 505 senses or detects the temperature of PA 502 or of a component therein (such as a power transistor) and generates a temperature signal 507 that may be provided to RFFE controller 114 or modem 106.

PA 502 comprises a plurality of power transistors 506 and 508, a plurality of inductors 510 and 512, an RFFE controller 516, a bias controller 518, an input match circuit 520, an inter-stage match circuit 522, and an output match circuit 524. Although memory 116 is described as external to PA 502, memory 116 may be internal to PA 502.

Input match circuit 520 provides impedance matching between RF receiver 102 and first stage power transistor 506. Inter-stage match circuit 522 provides impedance matching between first stage power transistor 506 and second stage power transistor 508. Output match circuit 524 provides impedance matching between second stage power transistor 508 and an external circuit, such as an antenna.

RFFE controller 516 receives clock and data including the ICQ register value for a selected RF channel for the PA 502 from RFFE controller 114 of modem 106. RFFE controller 516 provides the ICQ bias values to bias controller 518, which applies the selected bias to the respective bases of first stage power transistor 506 and second stage power transistor 508. In some embodiments, bias controller 518 comprises a plurality of registers (not shown) for storing the ICQ bias values provided by RFFE controller 516.

FIG. 6 illustrates a simplified diagram of a process flow 600 for controlling bias of a power amplifier according to an embodiment. Although process flow 600 is described for PA system 500, process flow 600 may be applied to other PA systems.

At 602, a frequency selection signal 120 is received to select a frequency of an RF input signal (RFIn) from RF transceiver 102. At 604, a temperature signal 507 indicative of the temperature of power amplifier 502 is received. In some embodiments, the process flow 600 does not include process part 604.

At 606, a bias current value corresponding to a channel is retrieved from memory 116 in response to the temperature signal 507 and the frequency selection signal 116. In some embodiments, the process flow 600 does not include process part 604, and at 606 retrieves a bias current value based on the frequency selection signal 116.

At 608, the retrieved bias current value is provided to power amplifier 502. At 610, a bias current corresponding to the retrieved bias current code is provided to bias a power transistor (or power transistors 506 and 508 for power amplifier 502).

FIG. 7 illustrates a simplified diagram of a process flow 700 for selecting bias values of a power amplifier according to an embodiment.

Although process flow 700 is described for PA system 100, process flow 700 may be applied to other PA systems.

At 702, a bias current value is selected for each frequency of a plurality of frequencies across a frequency band in response to a selection criteria of performance. The bias current value is selected from a plurality of performance values of a power amplifier as a function of bias current corresponding to the frequencies. The performance values can be, for example, the values from an ACLR as a function of channel, such as shown in FIG. 2. The selection criteria of performance may be, for example, maximization of power efficiency or minimization of ACLR of the power amplifier at said frequency.

At 704, the selected bias current values and the associated frequencies are stored in memory 116. The performance values may be a function of temperature, and the selected bias current values and the associated frequencies and temperatures are stored in memory 116.

Figure 8:
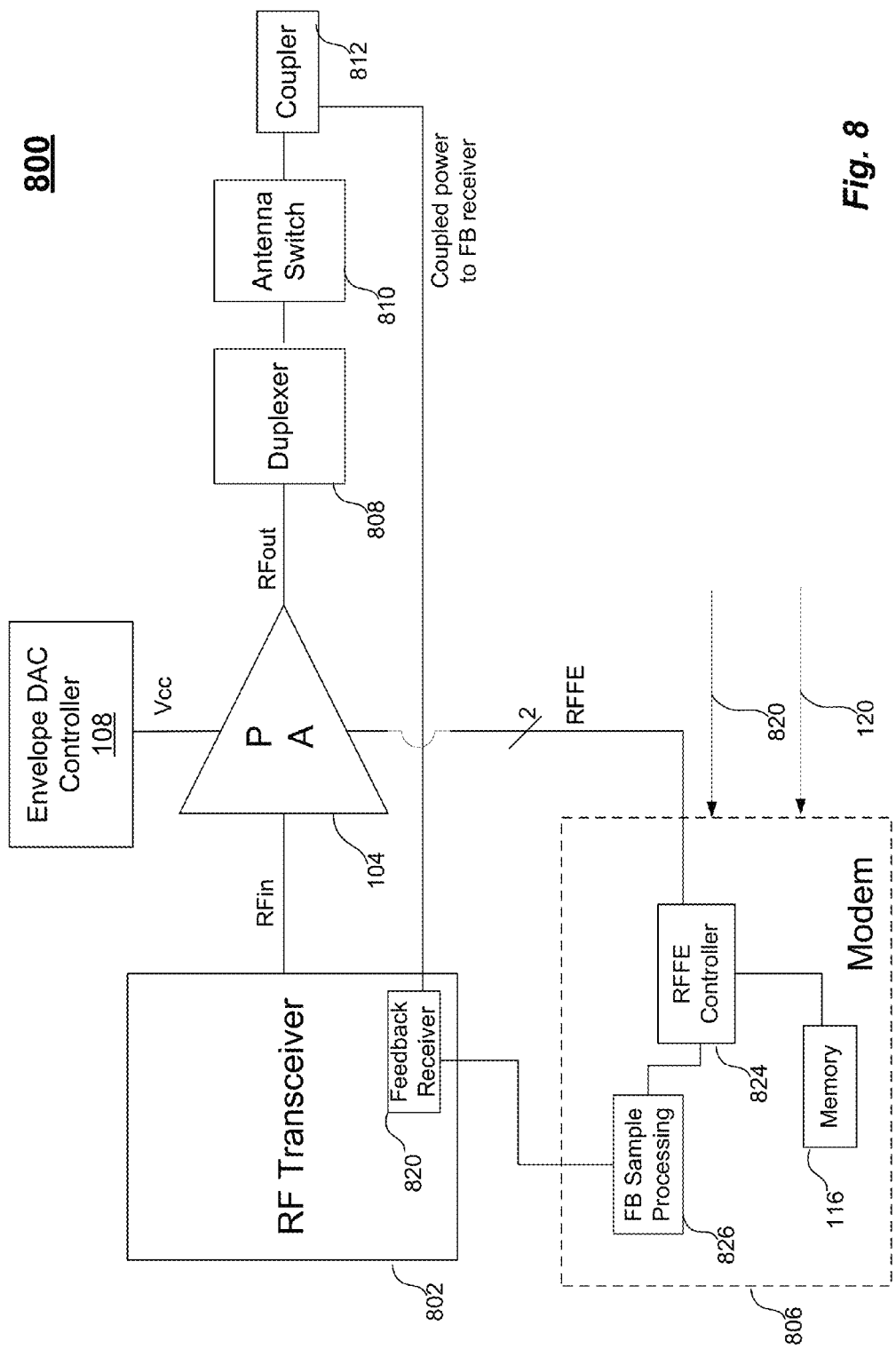
FIG. 8 illustrates a block diagram of a power amplifier (PA) system according to an embodiment.

FIG. 8 illustrates a block diagram of a power amplifier (PA) system 800 according to an embodiment. PA system 800 may provide dynamic biasing of the power amplifier based on frequency and may also be based on temperature to maximize or optimize performance at each frequency in a similar manner as PA system 100. PA amplifier system 800 further provides a feedback system for detecting and analyzing performance online or in real time and determine bias values for a selected frequency. PA system 800 comprises a radio frequency (RF) transceiver 802, a power amplifier 104, a modem 806, an envelope digital-to-analog converter (DAC) controller 108, a duplexer 808, an antenna switch 810, and a coupler 812. RF transceiver 802 comprises a feedback receiver 820. Modem 806 comprises an RF front end (RFFE) controller 824, a feedback (FB) sample processing circuit 826, and a memory 116.

Memory 116 stores bias current (ICQ) values to bias PA 104 for different frequencies across a frequency band to improve the efficiency or performance of power amplifier 104 and otherwise operates in a similar manner as described above for PA system 100.

PA 104 generates an RF output (RFOut) in response to an RF input (RFin) from RF transceiver 802. Envelope DAC controller 108 controls the supply voltage VCC to PA 104 for envelope tracking to change the supply voltage VCC based on the peak power of the RF input (RFIn). Duplexer 808 provides the RF output (RFOut) to antenna switch 810 and provides a received RF signal from antenna switch 810 to RF transceiver 802 (not shown in FIG. 8 for simplicity and clarity). Antenna switch 810 provides the RF output (RFOut) to coupler 812, which provides the RF output to an antenna (not shown) and to feedback receiver 820 of RF transceiver 802. Feedback receiver 820 provides mixing, down conversion, and processing of the feedback signal, which is at a frequency of the RF output. Feedback sample processing circuit 826 takes samples of the processed feedback signal from feedback receiver 820 and determines bias values for PA 104 in response to the processed samples, and provides the bias values to RFFE controller 824.

In response to an online mode signal 820 from an external system (not shown), PA system 800 executes a procedure to determine bias values at a selected frequency indicated by the frequency section signal 120. Bias values are selected based on the performance metric (such as those used in PA system 100) that is being evaluated. For example, PA system 800 may use ACLR as the performance metric. RFFE controller 820 provides a sequence of bias values to PA 104 that generates the RF output in response to the sequence of bias values applied to bias the power transistors in PA 104.

Feedback receiver 820 receives the coupled power from coupler 812, and mixes, downconverts, and processes the coupled power to provide a processed feedback signal to feedback sample processing circuit 826. For each bias value, feedback sample processing circuit 826 analyzes the processed feedback signal for the performance metric (in this example, ACLR) and determines the bias value that provides the minimum ACLR at the selected frequency.

Referring again to FIG. 2, feedback sample processing circuit 826 generates the data for a selected frequency (channel in FIG. 2) for the bias values, and selects the bias value that minimizes the ACLR. This allows the PA amplifier system 800 to determine during normal system operation the appropriate bias value from the online measurements. The determined bias values may be stored in memory 116 for later use, such as in the operation described in FIG. 6.

Figure 9:
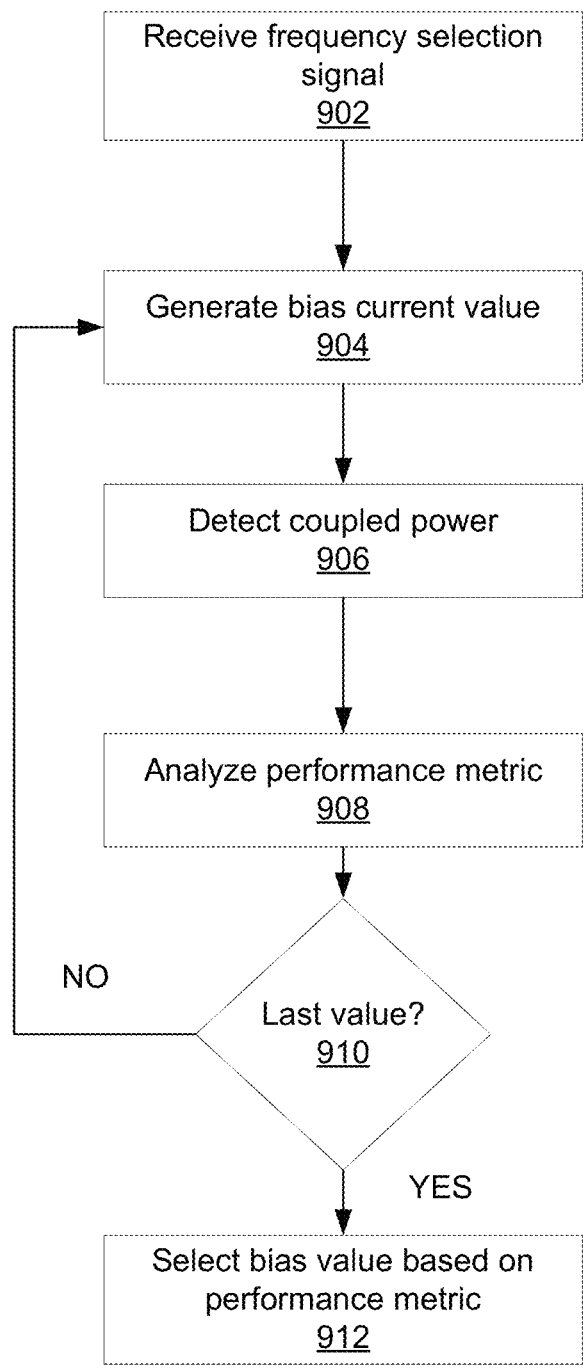
FIG. 9 illustrates a simplified diagram of a process flow for determining and controlling bias of a power amplifier according to an embodiment.

FIG. 9 illustrates a simplified diagram of a process flow 900 for determining and controlling bias of power amplifier 104 according to an embodiment. At 902, a frequency selection signal 120 is received. At 904, RFFE controller 824 generates a bias current value and provides the value to PA 104. At 906, coupled power is detected by feedback receiver 820. At 908, the processed feedback signal from feedback receiver 820 is analyzed for a performance metric. At 910, the loop returns to at 904 unless the last bias current value has been generated and the performance metric for the value is analyzed. At 912, a bias value is selected for the frequency based on the performance metric, such as minimizing ACLR.

The power amplifier system may change the biasing ICQ current to improve performance while keeping the transmit metrics the same or substantially the same. The ACLR may be improved by dynamically changing the bias without significantly changing the maximum power across the frequency range. Accordingly, the power amplifier system may be used in an external system, such as a phone, while maintaining the output power and keeping the total system current constant.

The power amplifier systems optimize a performance characteristic, such as ACLA or maximum power, at each frequency or channel across the frequency range. The optimization may also account for temperature. Although the systems are described for providing biasing at a specific channel or a specific channel at a specific temperature using the data in a table, the biasing may also be based on interpolation of values in the table.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a power amplifier comprising one or more power stage transistors;
   a memory that stores bias current values corresponding to a plurality of frequencies across a frequency band for setting bias of the one or more power stage transistors of the power amplifier based on selected frequencies;
   a controller configured to provide at least one bias current value corresponding to a selected frequency from the memory to the power amplifier in response to a frequency selection signal,
   wherein a first terminal of a first power stage transistor of the one or more power stage transistors is configured to receive a radio frequency input signal and a second terminal of the first power stage transistor is configured to receive a power supply voltage that changes based on the radio frequency input signal; and
   a feedback system for biasing the power amplifier during operation, wherein the feedback system is operable to evaluate an output signal of the power amplifier and to select a bias current value for the frequency of the output signal based on a performance metric of the power amplifier.

2. The circuit of claim 1 wherein the bias current value at each frequency is selected to maximize power efficiency of the power amplifier at said frequency, and wherein the bias current values are calibrated values to produce a maximum efficiency at each of the plurality of frequencies.

3. The circuit of claim 1 wherein the bias current value at each frequency is selected to minimize adjacent channel leakage-power ratio of the power amplifier at said frequency.

4. The circuit of claim 1 wherein the memory further stores bias current values corresponding to the plurality of frequencies across the frequency band at a plurality of temperatures for setting the bias of a power amplifier based on a temperature of the power amplifier and on selected frequencies.

5. The circuit of claim 4 wherein the bias current value is selected at different temperatures to maximize the power efficiency of the power amplifier at each temperature.

6. The circuit of claim 1 further comprising an envelope digital-to-analog controller for envelope tracking.

7. The circuit of claim 2 wherein the calibrated values at each of the plurality of frequencies comprise a positive offset frequency and a negative offset frequency from each of the plurality of frequencies.

8. A method comprising:
   receiving an output signal from a power amplifier comprising one or more power stage transistors during operation, the output signal having an associated signal frequency;
   determining a bias current value for the signal frequency of the output signal based on a performance metric of the power amplifier;
   storing the bias current value in a memory configured to store bias current values for a plurality of frequencies across a frequency band for setting bias of the one or more power stage transistors of the power amplifier based on selected frequencies;
   receiving a frequency selection signal;
   retrieving from memory the bias current value based on the frequency selection signal; and
   providing the retrieved bias current value to a controller to set the bias of the one or more power stage transistor of the power amplifier,
   wherein a first terminal of a first power stage transistor of the one or more power stage transistors is configured to receive a radio frequency input signal and a second terminal of the first power stage transistor is configured to receive a power supply voltage that changes based on the radio frequency input signal.

9. The method of claim 8 further comprising selecting the bias current value at each frequency to maximize power efficiency of the power amplifier at said frequency, wherein the bias current values are calibrated values to produce a maximum efficiency at each of the plurality of frequencies.

10. The method of claim 8 further comprising selecting the bias current value at each frequency to minimize adjacent channel leakage-power ratio of the power amplifier at said frequency.

11. The method of claim 8 wherein the memory further stores bias current values corresponding to a plurality of frequencies across a frequency band at a plurality of temperatures for setting the bias of a power amplifier based on a temperature of the power amplifier and on selected frequencies.

12. The method of claim 11 further comprising selecting the bias current value at different temperatures to maximize the power efficiency of the power amplifier at each temperature.

13. The method of claim 11 further comprising:
receiving a temperature signal indicative of the temperature of the power amplifier; and
retrieving from the memory a bias current value corresponding to a channel based on the frequency selection signal and the temperature signal.

14. The method of claim 8 further comprising:
envelope tracking peak power of a radio frequency input to the power amplifier; and
adjusting the power supply voltage applied to the power amplifier in response to the enveloped tracked peak power.

15. A method comprising:
applying a radio frequency input signal having a frequency to a power amplifier comprising one or more power stage transistors;
applying a plurality of bias currents to the power amplifier;
detecting a radio frequency output signal from the power amplifier at each of the plurality of bias currents via a feedback system coupled with the power amplifier;
determining a performance metric of the power amplifier from the radio frequency output signal for each bias current of the plurality of bias currents; and
selecting a bias current to bias the one or more power stage transistors of the power amplifier based on a criteria of the determined performance metrics,
wherein a first terminal of a first power stage transistor of the one or more power stage transistors is configured to receive a radio frequency input signal and a second terminal of the first power stage transistor is configured to receive a power supply voltage that changes based on the radio frequency input signal.

16. The method of claim 15 wherein the criteria of the determined performance metrics includes maximization of power efficiency of the power amplifier, wherein the bias currents are calibrated to produce a maximum efficiency at each of the plurality of frequencies.

17. The method of claim 15 wherein the criteria of the determined performance metrics includes minimization of adjacent channel leakage-power ratio (ACLR) of the power amplifier.

18. The method of claim 15 wherein the criteria of the determined performance metrics further includes temperature of the power amplifier, wherein a plurality of bias current values for a selected frequency are generated corresponding to a plurality of different temperatures.

* * * * *